United States Patent
Gloes et al.

(10) Patent No.: US 10,651,719 B2
(45) Date of Patent: May 12, 2020

(54) METHOD AND CONTROL DEVICE FOR CONTROLLING A COMMUTATION PROCESS OF A LOAD CURRENT BETWEEN SWITCHING MODULES

(71) Applicant: GE Energy Power Conversion Technology Limited, Rugby Warwickshire (GB)

(72) Inventors: Hendrik Gloes, Berlin (DE); Martin Geske, Berlin (DE); Piotr Szczupak, Berlin (DE)

(73) Assignee: GE ENERGY POWER CONVERSION TECHNOLOGY LIMITED, Warwickshire (GB)

( * ) Notice: Subject to any disclaimer, the term of this patent is extended or adjusted under 35 U.S.C. 154(b) by 0 days.

(21) Appl. No.: 16/229,733

(22) Filed: Dec. 21, 2018

(65) Prior Publication Data

US 2019/0199193 A1    Jun. 27, 2019

(30) Foreign Application Priority Data

Dec. 22, 2017    (EP) .................................... 17210481

(51) Int. Cl.
*H02M 1/08*    (2006.01)
*H03K 17/16*   (2006.01)
(Continued)

(52) U.S. Cl.
CPC .............. *H02M 1/08* (2013.01); *H02M 1/44* (2013.01); *H02M 7/538* (2013.01);
(Continued)

(58) Field of Classification Search
CPC ........... H02M 1/08; H02M 2001/0054; H02M 2001/0051; H02M 2001/0048;
(Continued)

(56) References Cited

U.S. PATENT DOCUMENTS 5,929,665 A * 7/1999 Ichikawa ................ H01L 29/00
                                                        327/109
6,107,844 A * 8/2000 Berg ................... H02M 7/5387
                                                        327/110
(Continued)

FOREIGN PATENT DOCUMENTS

DE         10323445 A1    12/2004
DE     102009001029 A1     8/2010

OTHER PUBLICATIONS

Fabre: "Parallel Connection of 1200-V/100-A SiC-Mosfet Half-Bridge Modules" IEEE Transactions on Industry Application, vol. 52, No. 2, Mar./Apr. 2016.
(Continued)

*Primary Examiner* — Gustavo A Rosario-Benitez
(74) *Attorney, Agent, or Firm* — Wood IP LLC

(57) ABSTRACT

A method and a device for controlling a commutation process of a load current between two switching modules are disclosed that each have a MOSFET that can be controlled by a gate-source voltage, and an intrinsic-body inverse diode. To reduce oscillations in the down-commutation of the inverse diodes caused by parasitic circuit parameters, after switching off one of the switching modules, the gate-source control voltage applied to this switching module is temporarily switched off until being increased again the vicinity of the threshold voltage for switching on the MOSFET, before and while the other switching module is switched on, in order to commutate the current from the inverse diode of the one switching module to the MOSFET of the other switching module.

20 Claims, 6 Drawing Sheets

(51) Int. Cl.
*H02M 7/538* (2007.01)
*H02M 1/44* (2007.01)
*H03K 17/687* (2006.01)
*H02M 1/00* (2006.01)

(52) U.S. Cl.
CPC ....... *H03K 17/163* (2013.01); *H03K 17/6871* (2013.01); *H02M 2001/0054* (2013.01)

(58) Field of Classification Search
CPC ......... H02M 2001/0058; H02M 1/088; H02M 7/42; H02M 7/44; H02M 7/537; H03K 17/6871; H03K 17/687; H03K 17/66; H03K 17/30
See application file for complete search history.

(56) References Cited

U.S. PATENT DOCUMENTS

| | | | | |
|---|---|---|---|---|
| 6,441,673 | B1* | 8/2002 | Zhang | H03K 17/0406 327/110 |
| 7,724,065 | B2 | 5/2010 | Bayerer et al. | |
| 2003/0107905 | A1* | 6/2003 | Miura | H01L 29/7803 363/41 |
| 2008/0122497 | A1* | 5/2008 | Ishikawa | H03K 17/168 327/108 |
| 2008/0265975 | A1* | 10/2008 | Takasu | H03K 17/08142 327/374 |
| 2010/0265746 | A1* | 10/2010 | Ishikawa | H03K 17/08128 363/131 |
| 2013/0271101 | A1* | 10/2013 | Nanov | H03K 17/162 323/282 |
| 2014/0049866 | A1* | 2/2014 | Reiter | H03K 17/0828 361/86 |
| 2015/0137871 | A1* | 5/2015 | Takano | H03K 17/0406 327/110 |
| 2016/0254750 | A1* | 9/2016 | Grezaud | H02M 1/08 323/271 |
| 2017/0047841 | A1* | 2/2017 | Zojer | H01L 27/0629 |
| 2017/0110965 | A1* | 4/2017 | Osanai | H02M 3/1584 |
| 2017/0302151 | A1* | 10/2017 | Snook | H02M 1/08 |
| 2018/0062633 | A1* | 3/2018 | Nomura | H03K 17/163 |
| 2019/0273428 | A1* | 9/2019 | Huang | H03K 7/08 |

OTHER PUBLICATIONS

Papadopoulos et. al.: "BIGT control optimisation for overall loss reduction" EPE ECCE Europe 2013.

Dulau et. al: "A New Gate Driver Integrated Circuit for IGBT Devices with Advanced Protections", IEEE Transactions on Power Electronic, vol. 21, No. 1 Jan. 2006.

Li: "Parallel Connection of Silicon Carbide MOSFETs for Multichip Power Modules", Department of Energy Technology, Aalborg University 2015.

European Search Report and Written Opinion dated Jun. 1, 2018 which was issued in connection with EP patent application No. 17210481.2 which was filed on Dec. 22, 2017.

Zhenxue Xu et al. "An Analysis and Experimental Approach to MOS Controlled Diodes Behavior", IEEE Transactions on Power Electronics, vol. 15, No. 5, Sep. 2000.

* cited by examiner

METHOD AND CONTROL DEVICE FOR CONTROLLING A COMMUTATION PROCESS OF A LOAD CURRENT BETWEEN SWITCHING MODULES

BACKGROUND OF THE DISCLOSURE

This application relates in general to the control of power MOSFETs (metal-oxide-semiconductor field-effect transistors) switching modules and, in particular, to a method and a device for controlling a commutation process of a load current from a first power MOSFET switching module to a second power MOSFET switching module.

Power semiconductor switches are used in various technical fields, e.g. in converters for converting electrical energy and for controlling the energy flow, such as for electrical machines, motors, generators, in power converters for power transmission, conversion and other applications. They can be used for switching high voltages, up to a few kV, at high switching frequencies, up to the high kHz range. While insulated-gate bipolar transistors (IGBTs) have become established in particular for regulated drives, power supply and transmission applications, metal-oxide-semiconductor field-effect transistors (MOSFETs) are at high switching frequencies and lower voltages. In view of rising energy costs, increasing environmental awareness and intense competitive pressure, there is a continuing desire for new power semiconductor switches and power modules formed from them that are more compact in terms of their design, have lower inductance, are less expensive and more efficient to produce, and that enable improved performance, power density, and efficiency.

For conventional switching applications, the power semiconductor switches must be able to accept a reverse voltage. Due to their structure, standard IGBTs are only able to supply voltage and carry current in one direction. Therefore, a separate free-wheeling diode is usually connected in antiparallel to the IGBT device that can accommodate the corresponding blocking voltage and permits current to flow in the reverse direction. This usually increases the construction volume, construction cost, connection technology and chip area and thus the cost of the switching module.

IGBTs are also known whereby a free-wheeling diode is monolithically integrated and these are referred to as reverse-conducting IGBTs (or RC-IGBTs for short). While the conduction behavior of a separate diode connected in antiparallel to the IGBT is independent of the control status of the IGBT, the integrated diode of an RC-IGBT shows a dependence on the control status of the IGBT. If the RC-IGBT is switched on in reverse operation, when the intrinsic-body diode carries current, an additional current path parallel to the intrinsic-body diode results, such that not all electrons can contribute to the flooding of the intrinsic-body PIN diode structure. This can lead to an undesired, increased voltage drop across the diode or the IGBT in reverse operation that results in increased semiconductor losses.

To prevent this, DE 10 2009 001 029 A1 proposes a device and a method for controlling an RC-IGBT that generate control signals to control the gate electrode to switch the RC-IGBT on and off according to a control signal, whereby switching on the RC-IGBT is blocked when the IGBT is conducting in the reverse direction, thus requiring current direction detection for the control and operation of the device.

Due to their bipolar nature, IGBTs have a tail current and show slower switching performance compared to unipolar devices such as MOSFETs. The blocking and reverse recovery time of a bipolar assembly and the comparatively higher switching energies caused by majority and minority charge carrier ratios thermally limit the maximum switching frequency. As a result, for applications with high switching frequency requirements, MOSFETs are increasingly used at higher voltages above 1,000 V. In addition, a threshold voltage does not occur in a MOSFET. The throughput behavior and conduction losses are determined in the MOSFET by an ohmic behavior that is characterized as resistance $R_{DS(on)}$. $R_{DS(on)}$ consists of different resistance components consisting of the channel, drift zone, enhancement layer, substrate, and other smaller quantities. In particular, more recently developed silicon carbide (SiC)-based MOSFETs offer significant switching speed advantages over conventional silicon-based IGBTs and the maximum depletion layer temperature. SiC MOSFETs benefit from a wider band gap, permitting higher critical field strength for comparatively thinner devices that reduce material costs and throughput losses. In addition, the larger band gap permits higher operating temperatures that in turn permit improved utilization of the devices, increase power density, and reduce the cost of the semiconductor cooling system. The development of SiC MOSFETs is not yet technologically complete, meaning that appropriate control strategies can offer additional advantages.

As far as MOSFET devices are concerned, if reverse conductivity is required, their intrinsic-body diode can be used. As a double-diffused structure (DMOS), the MOSFET forms an intrinsic-body diode, also referred to as an inverse diode. In this structure, it typically forms a PIN diode that permits current to flow in the reverse direction from the source-connected substrate, across the midregion to the drain contact. Compared to an optimized, discrete free-wheeling diode that is usually adapted to the IGBT or selected accordingly, the intrinsic-body inverse diode of the MOSFET is inferior in terms of its switching behavior and usually results in increased switching losses due to higher storage charging and possibly larger reverse current spikes. Intrinsic-body diodes are usually not or only partially optimized, whereby the distribution of the charge carriers in the device and their dynamics during switch-off can result in high-frequency oscillations and snappy switching behavior, which must be compensated or optimized by appropriate wiring, adjustment of the control or by an appropriate design of the semiconductor structure. However, the use of the inverse diode of a MOSFET permits a reduction in the required space, the chip area used and the structure and connection technology of the switching module. In conjunction with the unipolar structure of a MOSFET, it also permits a possible reduction of the reverse recovery time and consequently higher switching frequencies. For applications that are primarily intended for power converter operation, the saving of a discrete, additional diode represents a significant cost advantage that can be considered for the particular application and its requirement. For inverter mode applications, diodes are only little used compared to switching elements, which permits the saving of discrete diodes when using MOSFETs.

One disadvantage of MOSFETs, including SiC MOSFETs, is their strong dependence on the switching behavior of the parasitic circuit parameters. In particular, a MOSFET switching module during switch-off, when commutating the current flow from an inverse diode, tends to cause strong oscillations due to the leakage inductances and parasitic capacitances of the switching module in conjunction with the very short rise times and possible snappy switch-off behavior due to an abrupt reverse current break of the inverse diode. The oscillations during and after the switching transients result in increased switching losses, high voltage peaks and stronger electromagnetic radiated interference. The latter require expensive measures to improve the electromagnetic compatibility (EMC) in terms of robustness and emitted interference, with correspondingly increased manufacturing and component costs.

The current-carrying capacity of SiC MOSFETs is relatively limited. In applications with higher currents, therefore, several MOSFET switching modules must be connected in parallel to achieve the required current-carrying capacity. The oscillations of the commutating intrinsic-body diodes have a particularly disadvantageous effect here, because these oscillations of the parallel-connected inverse diodes can mutually influence and amplify each other. A reduction in these oscillations would be extremely important for a parallelization of the switching modules.

A common method of reducing such oscillations of inverse diodes of MOSFET switching modules to switching transients consists of increasing the gate resistances in the switching process. For example, the dissertation by Li, Helong "Parallel Connection of Silicon Carbide MOSFETs for Multichip Power Modules", Department of Energy Technology, Aalborg University, Denmark, 2015, describes the impact of increased switch-on and switch-off gate resistances on the switching behavior of SiC MOSFET switching modules. By increasing the gate resistance, the oscillations can be reduced, whereby the switching losses however increase. In general, however, there is a desire to minimize both the throughput and the switching losses.

In the publication by Zhenxue Xu et al. "An Analysis and Experimental Approach to MOS Controlled Diodes Behavior", IEEE TRANSACTIONS ON POWER ELECTRONICS, Vol. 15, No. 5, September 2000, different inverse diodes of power MOSFETs are studied, and it is described in terms of their behavior, how the storage charging and the reverse current peak of the inverse diodes for the commutation can be reduced by appropriate control of the MOSFET. In this case, the component is generally used as a diode or in the diode current direction in a step-down converter circuit. For commutation, the entire current is conducted across the unipolar channel of the MOSFET opened by $U_{GS}$, while the channel for conduction mode is closed and the bipolar structure of the PIN diode alone is effective. For open-channel commutation, the component's throughput voltage is lower than the intrinsic-body diode threshold voltage and the unipolar channel of the MOSFET is used for commutation, thereby reducing the storage charging and the return current spike.

DE 103 23 445 B4 describes a clocked DC control circuit for commutating a current flow between two controlled power components, in particular MOSFETs, that are connected and operated in the manner of a step-down converter circuit. In particular, one of the two power components is connected as a switching element, while the other power component is connected as a free-wheeling element. After initiating the switch-off operation of the switching element, the switch-on of the free-wheeling element is initiated, whereby the switch-off of the switching element is delayed and then the switching element is completely switched off and whereby the switch-on of the free-wheeling element is delayed during a predetermined time period during the complete switch-off of the switching element and is then switched on completely. By using the controlled free-wheeling element, it is achieved that it is not the relatively slow and interference-critical intrinsic free-wheeling diode of the switching element that determines the commutation, but rather the other power component that is arbitrarily rapidly switchable and serves as a free-wheeling element. Due to the active control of the free-wheeling element separate from the switched switching element, losses can be minimized without generating additional emitted interference.

BRIEF SUMMARY

Based on this, an object of the invention is to propose measures with which the above-mentioned shortcomings of conventional unipolar power semiconductor switches can be eliminated. In particular, an object of the invention is to provide a method and a device for controlling a commutation process of a load current from a first MOSFET switching module to a second MOSFET switching module that permits the oscillations caused by parasitic inductances and capacitances of the MOSFET switching modules to be reduced in a commutation of the current flow of an intrinsic-body inverse diode of the MOSFET switching module during and after corresponding switching transients, so as to promote a parallel switchability of the switching modules and improve their electromagnetic compatibility. In particular, the method and device for use with MOSFET switching modules, e.g. SiC-based, must be appropriate for power converters for various applications, including high-frequency pulsing of the switching module. In addition, the method and device must enable a control that permits improved commutation independent of the current direction in the down-commutating MOSFET switching module. In this sense, the method must generally be used in power converters, independent of the current direction.

To achieve this object, a method and a device for controlling a commutation process of a load current from a first switching module to a second switching module with the claimed features are provided.

According to a first aspect of the invention, a method is provided for controlling a commutation process of a load current from a first switching module to a second switching module, whereby the first and the second switching module each comprise a first and a second MOSFET, i.e. an intrinsic-body MOSFET structure, and a first or second intrinsic-body inverse diode. The first and the second MOSFET can be controlled by a gate-source voltage to be switched on, i.e. to be made conductive, or switched off, i.e. to be made nonconductive. The method includes the step of applying a first control voltage to the first switching module to switch it off for a first time period, whereby the level of the first control voltage is below a predetermined threshold voltage above which the first MOSFET becomes minimally conductive. The first time period is selected such that the first inverse diode essentially takes over the load current completely. The method further includes the step, after the first time period, of applying a second control voltage to the first MOSFET switching module for a second time period to influence a switch-off behavior of the first inverse diode. The second control voltage has an intermediate level that is between the level of the first control voltage and the level of the threshold voltage of the first switching module. The method further includes the step of applying a third control voltage to the second MOSFET switching module to switch it on, whereby the level of the third control voltage is above a predetermined threshold voltage above which the second MOSFET becomes minimally conductive, so as to cause a commutation of the load current from the first inverse diode to the second MOSFET. The method further includes applying to the first switching module, after the expiration of the second time period, a fourth control voltage with a level below the intermediate level of the second control voltage to block the first switching module or hold it in the blocked status.

The invention is based on the finding that the switch-off behavior of a MOSFET switching module in conjunction with its inverse diode can be positively influenced by a selective control of the MOSFET, in particular an appropriate selection of the height and course of the control voltage for the reverse current operation, i.e. the current flow direction of the inverse diode. By applying the first control voltage, the first MOSFET of the first switching module is switched off rapidly and safely, so as to eliminate the risk of a short-circuit through the two switching modules, in particular, a bridge short-circuit, the subsequent switch-on of the second switching module is eliminated and a rapid takeover of the load current by the associated first inverse diode is achieved. This also results in a faster and safer switching operation as a whole compared to the case when the intermediate stage is applied immediately without the previous first control voltage.

The subsequent intermediate stage of the second control voltage with an intermediate level higher than the level of the first control voltage results in a reduction in the oscillations associated with conventional MOSFET components in interaction with the intrinsic-body diode during and after switching transients. The intermediate level of the second control voltage is below the threshold voltage of the first MOSFET, and just below it, above the zero voltage. Without wishing to be bound by theory, it is believed that by temporarily increasing the control voltage to near the threshold voltage, the channel of the MOSFET can be influenced to reduce the channel resistance and influence the charge carrier distribution in the device, whereby the switch-off performance of the inverse diode is positively influenced during the commutation process. The targeted control of the MOSFET that is not switched on (i.e. the control voltage is slightly lower than the threshold voltage), for operation with reverse current direction, makes it possible to optimize the switch-off behavior of the diode by influencing the ohmic characteristics and the charge carrier distribution within the component. The commutation behavior of the diode is achieved by targeted reduction of the channel resistance and influencing the charge carrier distribution in the PIN structure, without switching on the MOSFET. Both effects are used by an appropriate control in an advantageous manner. Thereby, the normally occurring oscillations that are disadvantageous or even harmful for the power semiconductors and e.g. a power converter system, can be effectively damped and the switching behavior of the diode can be influenced without needing to increase the external gate resistance. For the operation of parallel MOSFET switching elements, oscillations both within the assembly and between parallel components can be reduced significantly, which is of great importance for faster commutation processes, as are typical for MOSFET and in particular SiC-MOSFET components.

After the switch-off behavior of the first inverse diode has been advantageously influenced, the second MOSFET switching module can be switched on by an appropriate third control voltage and the correspondingly reduced fourth control voltage applied to the first switching module to cause final, fast and complete commutation of the load current from the first inverse diode to the second MOSFET. Despite the inserted intermediate stage of the second control voltage, the switching times in the switching sequence according to the invention can be kept very low. This permits switching frequencies of the switching modules in the range of a few Hz to kHz or very high switching frequencies of a few tens or hundreds of kHz. Even switching frequencies in the MHz range are possible for low-power applications. The method thus makes the use of the switching modules appropriate for different applications.

In embodiments of the method according to the invention, a second control voltage with an intermediate level between the level of a first control voltage for switching off the down-commutating switching module and the level of the threshold voltage of the down-commutating switching module, is applied in each commutation process from the first switching module to the second switching module and vice versa, independent of the current flow direction. In other words, the second control voltage with the intermediate level is applied before applying a third control voltage to fully switch on the other switching module to which the current is commutated, both when the down-commutating switching module is operated in the forward current flow direction and when the down-commutating switching module is operated in the reverse current flow direction. Advantageously, no detection of the current flow direction by the switching modules is then required, which reduces the circuit and control complexity.

In alternative embodiments, the method is used only in commutation processes when the down-commutating switching module is operated in the reverse current flow direction and the switch-off behavior of the associated down-commutating inverse diode can be improved. In other words, a second control voltage with an intermediate level between the level of a first control voltage for switching off the down-commutating switching module and the level of the threshold voltage of the down-commutating switching module is applied in each commutation process from the first switching module to the second switching module and vice versa before applying a third control voltage for complete switching on the other switching module only when the instantaneous load current in the reverse current flow direction flows through the down-commutating switching module. For this purpose, the current flow direction is suitably detected by the switching modules.

Independent of the embodiments mentioned above, in advantageous embodiments, the switch-on of the switching module to which the load current is commutated can be performed in two or more stages, at least with an intermediate stage of the control voltage that is below the level of the third control voltage to fully switch on the switching module and above the threshold voltage. In the event of a short-circuit in a switching module, the short-circuit current level can thus be limited with the reduced intermediate level of the control voltage. In addition, this measure permits a reduction in the effort to detect a short-circuit in the component.

The first and second switching modules can advantageously be arranged in a common commutation circuit and connected via line elements in a directly or indirectly conductive manner. They can be connected in series directly to each other in a conductive manner. However, other components can also be inserted between the first and the second switching modules.

In certain applications, the first and second switching modules form a half-bridge circuit that can be connected to a DC voltage supply, e.g. a DC voltage intermediate circuit of a power converter, etc. The connection point between the switching modules can form a bridge tap, to which a load, in particular an alternating current (AC) load with an inductive component, e.g. an electrical machine, an electric motor, etc. can be connected. Other circuits, e.g. full bridge circuits, can also be created and operated using the method according to the invention.

In embodiments of the invention, the method is part of a control method for a power converter, whereby the first and second switching modules form a power module that forms at least one phase branch of the power converter. The power converter can have any topology, in particular a two-stage, three-stage or multistage, single or multiphase power converter of any design, e.g. NPC, NPP or other currently known or future developed design. In particular, for power converters with high switching frequencies in the kHz range up to a power of a few MW or low-power applications below one kW in the MHz range, the method is highly appropriate. The reduced oscillations of the commutating diode improve the switching behavior, reduce switching losses and improve electromagnetic compatibility with regard to the robustness and emissions of the entire power converter.

The power converter can have a number of phase branches corresponding to the number of phases, three phase branches, each phase branch having one or more first switching modules in series and/or parallel to each other and one or more second switching modules connected in series and/or parallel to each other. An equal number of first and second switching modules is present to create a symmetrical structure of the power converter. Such power converters can be advantageously used for different applications, including for the control of drives, for power supply and distribution.

In applications, each power module or each phase branch of the power converter has two or more first switching modules connected in parallel to each other and two or more second switching modules connected in parallel to each other. The first and the second switching modules are switched synchronously with each other. The parallel connection of the switching modules permits a higher overall current-carrying capacity for corresponding applications in the high power range. The reduced oscillations of the down-commutating inverse diodes reduce the influence of the switching modules connected in parallel to each other while also ensuring an improved dynamic current distribution by equalizing the switching behavior. In principle, a single gate-driver unit is sufficient to control a plurality of switching modules connected in parallel. Each switching module is associated with a gate-driver unit, whereby the gate-driver units are controlled synchronously by a common control unit.

The method according to any of the above-mentioned embodiments can further comprise receiving a switching request signal from a higher-level control, whereby the first control voltage is applied in response to receiving the switching request signal. The switching request signal can e.g. be a switch-off request signal relating to the first switching module. It is possible that separate switch-on and switch-off signals for the first and second switching modules are received by a control device of the higher-level control, whereupon the application of the control voltages to the switching modules and their timing are coordinated by the common control device. However, it would also be possible to send only a single switching signal from the higher-level control to the common control device that could then automatically generate or cause the generation of all control voltages in the required time sequence.

In the method of any of the above-mentioned embodiments, in a time period prior to applying the first control voltage, a control voltage can advantageously be applied to the first switching module with a voltage level above the threshold voltage of the first MOSFET of the first switching module, such that the first switching module becomes conductive. At the same time, a control voltage can be present or be applied to the second switching module that has a voltage level below the threshold voltage of the second MOSFET of the second switching module, such that the second switching module is blocked.

In any of the above-mentioned methods, the first time period can be set in advance such that the first inverse diode carries at least 90%, and, in some examples, at least 95%, of the load current from the first MOSFET under the assumed operating conditions before the second control voltage with the intermediate level is applied.

In addition or alternatively, the third control voltage can be applied to the second switching module during the second time period. The two steps can at least overlap in time to minimize the switching time.

In particular, the time sequence of the method can be advantageously determined such that the third control voltage is applied to the second switching module within the second period ($t_2$), and the second MOSFET then carries at least 90%, and, in some examples, at least 95%, of the load current from the first inverse diode before the fourth control voltage is applied to the first switching module.

The method according to this invention is particularly appropriate for use with silicon carbide (SiC) MOSFETs that offer the advantages of extremely high switching speeds, high maximum permissible depletion layer temperature, low control and component power dissipation loss, and a basis for good operating behavior and high efficiency of the power modules and the power converters created from them. In this regard, the first and second MOSFETs are, in some examples, SiC MOSFETs. Independent of whether or not they are based on SiC, the first and second MOSFETs have the same conductivity type, i.e. either n-channel or p-channel MOSFETs. n-channel SiC MOSFETs may be used due to their inherent properties. In principle, p-channel MOSFETs or even combinations of n- and p-types are also possible.

In exemplary embodiments of any of the above-mentioned methods, the level of the control voltage for the first or second switching module in the conductive status can be about 15-25 V, and, in some examples, about 20 V, and the level of the third control voltage when the threshold voltage is in the range of about 2 to 7 V. The level of the first and fourth control voltage can then be about 0 to −10 V, and, in some examples, about −5 V. The intermediate level of the second control voltage can be about −10 to +4 V, e.g. between −3 and +1 V, if only the channel resistance is influenced but a conductive status of the MOSFET must be prevented.

In further embodiments, it is also possible, during the first time period, to set the level of the first control voltage between the intermediate voltage level and the level of the fourth control voltage, i.e. above the latter, to further influence the switch-off behavior of the MOSFET and the commutation behavior of the inverse diode.

According to yet another aspect of the invention, a device is provided for controlling a commutation process of a load current from a first switching module to a second switching module, whereby the first and the second switching module each comprise a first and a second MOSFET that can be controlled by a gate-source voltage, and that have a first and second intrinsic-body inverse diode. The control device has a gate-control device that is connected in communication with a higher-level control to obtain binary switching request signals from the latter. The gate-control device is further configured to perform a method as described above.

With regard to the different embodiments, effects and advantages of the control device, reference is made to the above description of the method according to the invention that apply here accordingly.

To implement the method according to the invention, the control device preferably has at least one gate-driver unit that is capable of generating at least three different voltage levels to control the associated switching module(s), whereby the voltage levels comprise the levels of the first, second and third control voltages.

In an implementation of the control device according to the invention and the method according to the invention, the at least one gate-control device unit can have a first controllable switch that is connected on the one hand to a positive voltage potential and on the other hand via a closing resistor to a gate of the first or second switching module, and a second having a controllable switch that is connected on the one hand to a negative voltage potential and on the other hand via an opening resistor with the same gate of the first and second switching module. The voltage potentials, the closing resistor and the opening resistor can advantageously be dimensioned such that, when the two switches are switched on simultaneously, the intermediate level of the second control voltage is applied to the gate of the first and second switching module and below, in some examples, in the range of the threshold voltage of the MOSFET, whereby the method can advantageously be constructed without more complex driver stages.

BRIEF DESCRIPTION OF THE DRAWINGS

Further advantageous details of embodiments of the invention result from the dependent claims, the drawing and the associated description. The invention is described in more detail below based on a drawing, which shows exemplary, by no means limiting embodiments of the invention, wherein the same reference signs are used in all figures to indicate the same elements. The drawings in detail:

DETAILED DESCRIPTION

Figure 1:
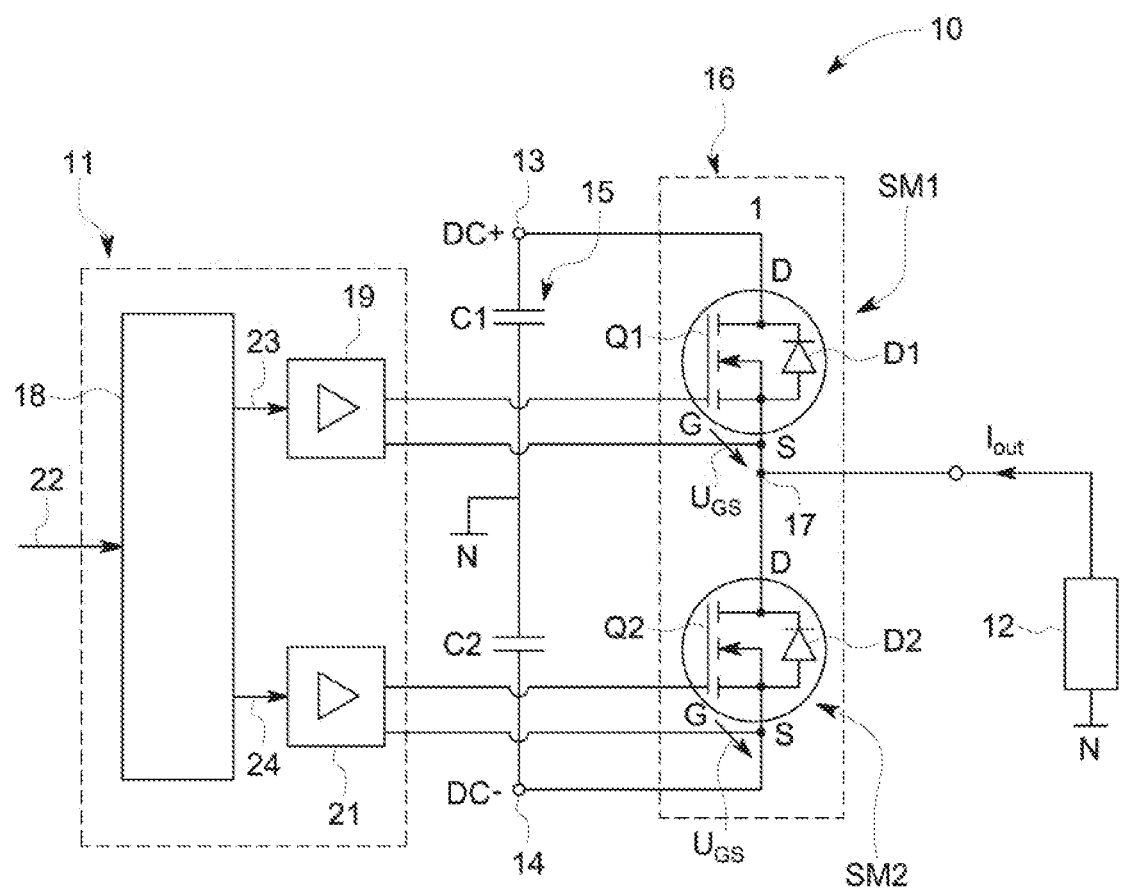
FIG. 1 is a schematic representation of a power module with switching modules switched to a half-bridge according to one embodiment of this invention, in a greatly simplified illustration of the principle.

FIG. 1 illustrates, in a highly simplified schematic representation, an exemplary power module 10 according to one embodiment of this invention. The power module 10 has two switching modules SM1 and SM2 that are controlled by a control device 11 to supply power from a DC power supply (DC+/DC−) to a load 12 in a controlled manner. As can readily be seen, the switching modules SM1 and SM2 form a half-bridge by being connected in series with each other and connected between the positive terminal 13 and the negative terminal 14 of the DC power supply (not shown here).

The DC voltage supply can also be a DC intermediate circuit of an inverter and the DC voltage $U_{DC}$ applied to the terminals 13, 14 obtained by rectification of an AC voltage. For example, FIG. 1 illustrates one embodiment with a DC intermediate circuit 15 formed from two series-connected DC link capacitors C1, C2 connected between the DC terminals 13, 14 and whose connection point is connected to a local reference point N. The capacitors C1, C2 may have the same capacitances such that, across the capacitors C1, C2 substantially the same voltage drops, each corresponding to half the DC voltage $U_{DC}$.

Each of the switching modules SM1 and SM2 has at least one first transistor Q in parallel to a diode D. In particular, the first switching module SM1 has a first transistor Q1 in antiparallel to a first diode D1, while the second switching module SM2 has a second transistor Q2 antiparallel to a second diode D2. Although here the upper switching module SM1 of the half-bridge 16 with the transistor Q1 and the diode D1 are referred to as "first", while for the lower switching module SM2 with the transistor Q2 and the diode D2 the term "second" is used, this serves only to distinguish the two switching modules from each other, and does not indicate any order or importance. The expressions "first" and "second" for the switching modules SM1 and SM2 and their components could also be interchanged.

In the illustrated embodiment, the first transistor Q1 and the second transistor Q2 are metal-oxide-semiconductor field-effect transistors (MOSFETs). The term MOSFET is understood herein to mean all insulated-gate field-effect transistors, also referred to as IGFETs, independent of whether the gate material is a metal or other material, e.g. doped polysilicon, germanium nitride, etc. In this regard, the term MOSFET or MOSFET structure is generally used for the transistor Q1 or Q2. In any case, the switching modules SM1, SM2 are unipolar components that only use the majority carriers in other words, either electrons or p-holes, in the current routing. In contrast to e.g. insulated-gate bipolar transistors (IGBTs), wherein the bipolar characteristics, storage charging and tail current results in comparatively longer switching times, this effect is largely eliminated in unipolar semiconductor components, such that significantly higher switching frequencies can be achieved. The power module 10 with the MOSFET switching modules SM1 and SM2, as illustrated in FIG. 1, can also be used for extremely high switching frequencies in the kHz range, of a few tens or hundreds of kHz, or even in the MHz range. Particularly, in some examples, the switching modules SM1, SM2 are manufactured based on silicon carbide (SiC). SiC MOSFETs have significant advantages in terms of extremely high switching frequencies, high maximum depletion layer temperature, and low control and device power dissipation loss. They permit good operating behavior and high efficiency of the resulting power modules. However, MOSFETs based on silicon, e.g. doped polysilicon, could also be used.

As further shown in FIG. 1, the MOSFETs Q1, Q2 used herein are of the n-channel type. n-channel MOSFETs are superior in their characteristics to p-channel MOSFETs and permit easier wiring and control. However, p-channel MOSFETs could also be used herein.

The diodes D1 and D2 are intrinsic-body diodes of the respective transistor Q1 or Q2. As is well known to those skilled in the art, the MOSFET forms a double-diffused structure that includes a p-n junction between source and drain. This transition becomes conductive when the MOSFET is operated in the reverse direction, e.g. in an n-channel MOSFET or e.g. when a higher voltage is applied to the source than to the drain. Since this is the reverse direction compared to normal operation, this intrinsic p-n junction is also referred to as an inverse diode. Using the intrinsic-body inverse diode of the MOSFETs Q1, Q2, operation can occur in both the forward and reverse directions, with space and cost savings in the power module 10 being apparent compared to discrete diodes that are antiparalleled for this purpose, e.g. to an IGBT.

Returning to FIG. 1, a drain terminal D of the first MOSFET Q1 is connected to the positive terminal 13 of the DC power supply, while its source terminal S is connected to the drain terminal D of the second MOSFET Q2. The source terminal S of the second MOSFET Q2 is connected to the negative terminal 4 of the DC power supply. The gate and source terminals G, S of the transistors Q1, Q2 are further coupled to the control device 11.

The connection point between the two switching modules SM1 and SM2 forms a bridge tap 17, to which the load 12 is connected. In particular, the load 12 is connected between the bridge tap 17 and here the local reference point N. The load 12 is an alternating voltage or alternating current load (ACT load), e.g. an electrical machine powered by the power module 10. In general, the load 12 has both an ohmic and an inductive part.

To control the power module 10, the control device 11 with an evaluation and control unit 18 and gate-driver units 19, 21 is used. The evaluation and control unit 18 is communicatively connected to a higher-level control (not shown here) and configured to control a switching request signal 22 received from the higher-level control for switching on and off the switching modules SM1, SM2 and the gate-driver units 19, 21 as a response to the switching request signal 22 in a coordinated manner to effect the switch-on and switch-off of the switching modules SM1, SM2 in a controlled manner. The gate-driver units 19, 21 are respectively connected to the gate and the source terminal G, S of the first and second MOSFETs Q1 and Q2, and arranged to switch on the respective MOSFETs Q1 and Q2 by applying an appropriate gate-source control voltage $U_{GS}$, such that this becomes conductive, or to switch them off, such that it does not conduct or is blocked. As is well known, the MOSFETs Q1 and Q2 can be switched on when the voltage $U_{GS}$ is greater than a specific threshold voltage $U_{TH}$, while at a gate-source control voltage $U_{GS}$ below the threshold voltage $U_{TH}$, the respective MOSFET is switched off. As explained in more detail below, the gate-driver units 19, 21 are configured to generate control voltages $U_{GS}$ at different levels, including a voltage above the threshold voltage $U_{TH}$, a second control voltage in the vicinity of and below the threshold voltage, and a third control voltage well below the threshold voltage and to apply them to the transistors Q1, Q2. In a known manner, for the switch-on and off of the MOSFETs up to a current for transferring parasitic capacitances and the gate capacitance, no essential control current is required, such that the gate-driver units 19, 21 advantageously do not need to have any significant current-carrying capacity. The gate-driver units 19, 21 are both communicatively connected to the evaluation and control unit 18 to receive control signals 23, 24 from it and then to switch the respective transistors Q1 and Q2.

In operation, the control device 11 controls the first switching module SM1 and the second switching module SM2 in a modulated manner with high switching frequencies of e.g. several or a few tens of kHz, e.g. starting from the DC supply voltage to the DC terminals 13, 14, to generate an AC voltage and an AC current with the desired frequency of e.g. 50 or 60 Hz at the output terminal 17 for supplying the load 12. It must be understood that the power module 10 can also be operated in the opposite direction, for voltage rectification with an energy flow from the AC terminal 17 to the DC terminals 13, 14 and the embodiments apply accordingly. In any case, the control device 11 operates the switching modules SM1, SM2 in a complementary manner such that, when the first switching module SM1 is conductive, the second switching module SM2 is blocked at the same time, and vice versa. An operation whereby both switching modules SM1, SM2 are conductive at the same time must be prevented, because this would result in a short-circuit of the DC voltage supply connected to the power supply terminals 13, 14.

When the first switching module SM1 is conductive while the second switching module SM2 is blocked, the bridge tap 17 is connected to the positive power supply terminal (DC+) 13, providing a positive supply voltage to the load 12. A current flows e.g. during a positive half cycle of the output side AC voltage from the positive power supply terminal 13 through the first MOSFET Q1 and, if the voltage drop across the load current within the MOSFET exceeds the threshold voltage of the diode D1 and switches it on, through the first diode D1 inti the load 12.

If subsequently the switching module SM1 is switched off, while the second switching module SM2 continues to be blocked, the inductive load 12 maintains the current flow. In this case, this current flow is first made possible by the first intrinsic-body inverse diode D1 of the first switching module SM1 that, when the first MOSFET Q1 is switched off, conducts the current in the reverse flow direction of the switching module SM1, as soon as its forward voltage exceeds the throughput voltage.

Subsequently, when the second switching module SM2 is switched on and becomes conductive, the bridge tap 17 is coupled to the negative power supply terminal (DC−) 14 that in some embodiments can also be connected to ground. As soon as the flux voltage of the inverse diode D1 of the first switching module SM1 falls below the throughput voltage, the inverse diode D1 is blocked, and the current commutates from this to the second MOSFET Q2 of the second switching module SM2.

If the second switching module SM2 is then switched off and then the first switching module SM1 is switched on again, the conditions are reversed, such that the current flow is ultimately carried again by the first conductive switching module SM1, while the second switching module SM2 is blocked. The processes are repeated.

In the transition, when the first switching module SM1 is switched off and the load current is positive and the second switching module SM2 is switched on, the current flowing through the intrinsic-body inverse diode D1 of the first switching module SM1 must be commutated to the MOSFET Q2 of the second switching module SM2. (The following explanations apply equally to the transition when the current commutates from the inverse diode D2 of the second switching module SM2 to the MOSFET Q1 of the first switching module SM1.) When the inverse diode D1 (or D2) is switched off because the throughput voltage of the diode is lower than the throughput voltage, the intrinsic-body inverse diode of a MOSFET tends to oscillate due to the nonoptimized switch-off behavior, parasitic capacitances, and inductances. Significant oscillations of the voltage across the inverse diode and the diode current can be produced with significant overvoltages and current spikes and with very high rates of change (du/dt, di/dt).

To prevent this, a method for controlling the commutation process of a load current from one of the switching modules SM1 or SM2 to the other switching module SM2 or SM1 is provided according to the invention, whereby such oscillations can be at least significantly reduced during the commutation process. The method according to the invention is explained in more detail below in connection with FIGS. 2 and 3.

Figure 2:
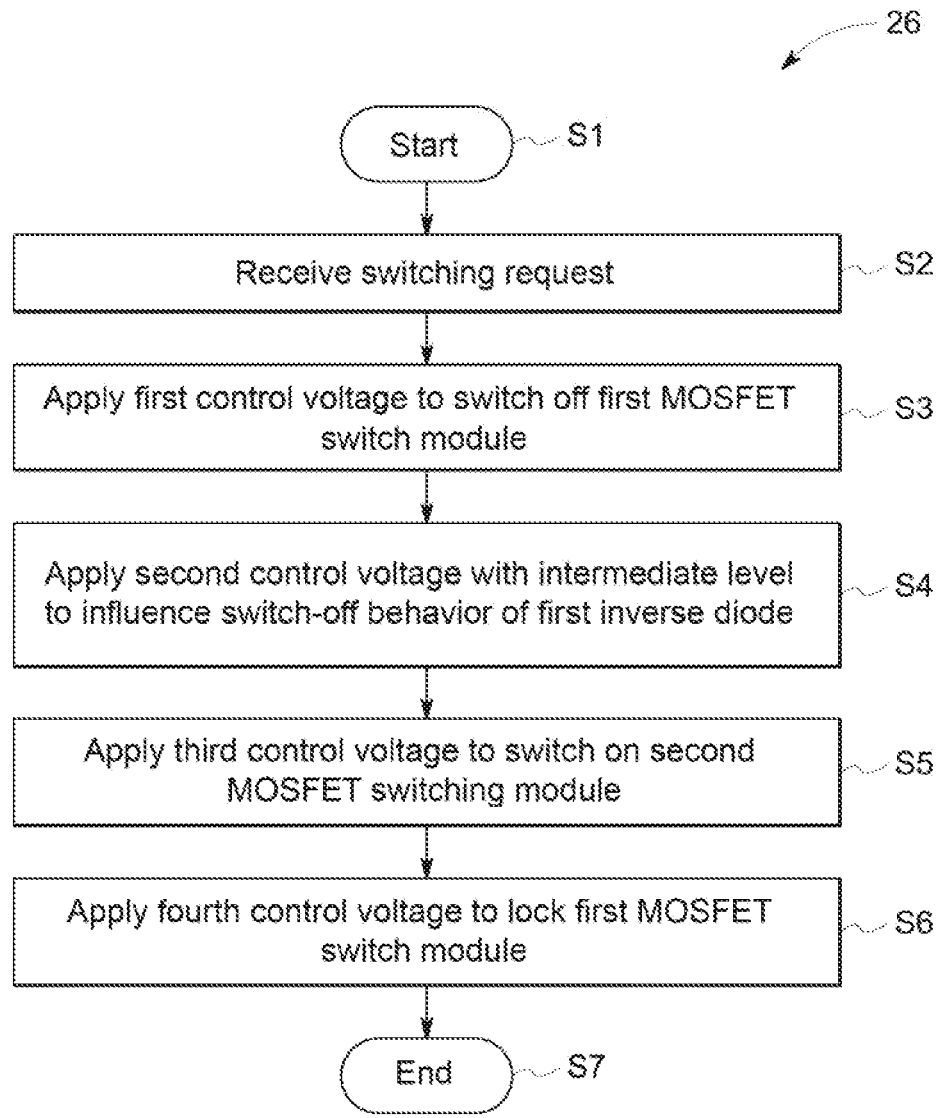
FIG. 2 shows a method for controlling the switching modules of the power module according to FIG. 1 according to one embodiment of the invention.

FIG. 2 shows a flow chart of a method 26 according to the invention for commutating a load current of a first MOSFET switching module, e.g. SM1 in FIG. 1, to a second MOSFET switching module, e.g. SM2 in FIG. 1. Exemplary time profiles of appropriate gate-source control voltages $U_{GS1}$ and $U_{GS2}$, that can be used in method 26, are shown in a highly simplified manner in FIG. 3. The method 26 starts in step S1, after which a switching request is received by a higher-level control in step S2. The switching request can be e.g. the switching request signal 22 in FIG. 1. This can be a binary signal indicating e.g. whether the upper switching module SM1 or the lower SM2 must be switched on. The control device 11 detects and evaluates the switching request signal 22 and controls the gate-driver units 19, 21, such that they act on their respective switching module SM1 or SM2 with an appropriate control voltage $U_{GS1}$, $U_{GS2}$ according to a predetermined timing scheme. Different switching request signals 22 for switching on and off and for the first and second switching modules SM1 and SM2 could also be transmitted from the higher-level control to the control device 11 to reduce the evaluation and control effort in the latter.

Figure 3:
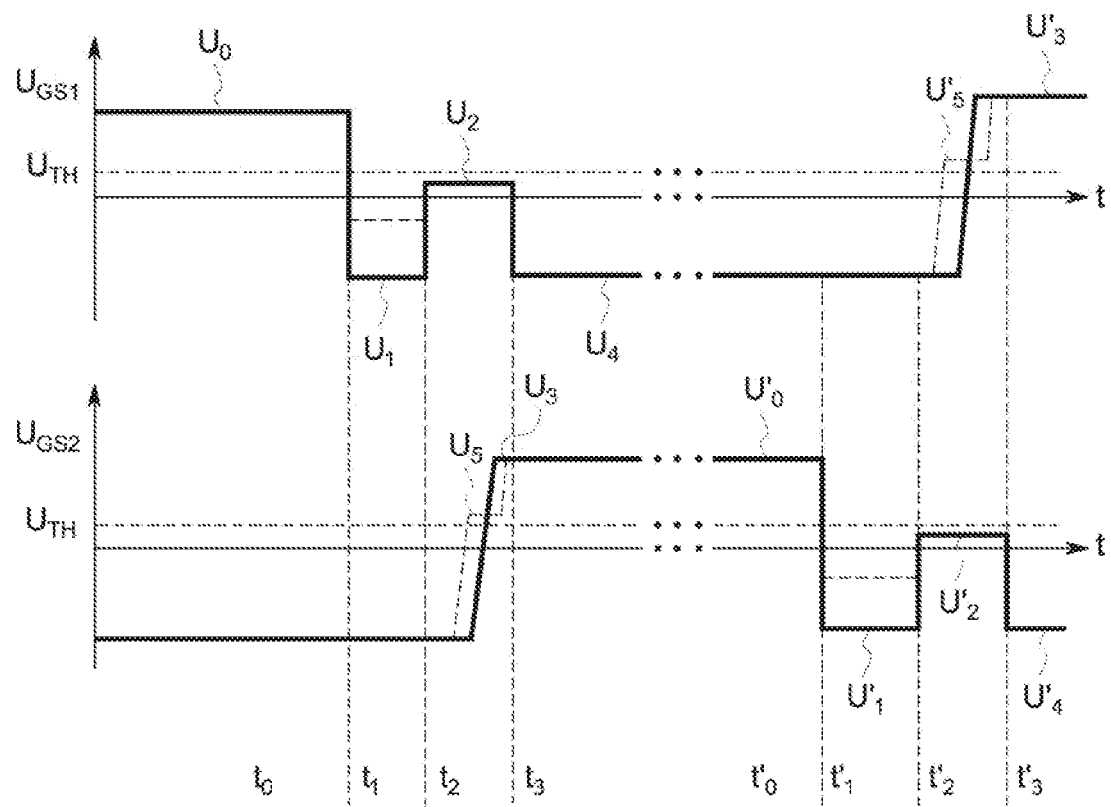
FIG. 3 shows timing diagrams illustrating the control signals in performing the method of FIG. 2.

As shown in FIG. 3, the gate-source control voltage $U_{GS1}$ applied to the first MOSFET Q1 by the gate-driver unit 19 has a positive voltage level $U_0$ in the time period to before receiving the switching request after step S2 in FIG. 2, which is higher than the threshold voltage $U_{TH}$ of the MOSFET. The first switching module SM1 is therefore conductive, whereby it being assumed here that the load current $I_{out}$ flows in the direction shown in FIG. 1 into the circuit arrangement and in the reverse flow direction through the first MOSFET Q1. The gate-source control voltage $U_{GS2}$ for the second MOSFET Q2 is negative and is well below the threshold voltage $U_{TH}$ for the MOSFET Q2, such that the latter is blocked. For simplification, it is assumed that switching modules SM1, SM2 of the same type are used and the threshold voltage $U_{TH}$ is identical for both, although this is not absolutely necessary.

Returning to FIG. 2, after receiving the switching request in step S3, a first control voltage $U_{GS1}$ is then applied to the first MOSFET switching module SM1 to switch it off. As can also be seen from FIG. 3, the first control voltage is applied for the first time period $t_1$, whereby the level $U_1$ of the first control voltage is below the predetermined threshold voltage $U_{TH}$, above which the first MOSFET Q1 becomes minimally conductive. To achieve a fast and safe switch-off of the MOSFET Q1, a negative voltage that is well below the threshold voltage $U_{TH}$ is selected as the control voltage. The first MOSFET Q1 is then switched off, while the first inverse diode D1 carries the load current. The first time period $t_1$ is selected sufficiently such that the inverse diode D1 can largely carry the load current. This means that the inverse diode D1 carries at least 90%, and, in some examples, at least 95% or more, of the load current. Particularly, in some examples, the inverse diode D1 should carry 100% of the load current at the end of the time period $t_1$.

After expiration of the period $t_1$, according to a step S4 of the method according to FIG. 2, a second control voltage is applied to the first switching module SM1 for a second time period $t_2$, to influence a switch-off behavior of the first inverse diode D1 for the subsequent commutation of the load current $I_{out}$ to the second MOSFET Q2. As also shown in FIG. 3, the level $U_2$ of the second control voltage is selected between the level $U_1$ of the first control voltage and the level of the threshold voltage $U_{TH}$. In the example shown in FIG. 3, the intermediate level $U_2$ is selected to be just below the threshold voltage $U_{TH}$. However, the intermediate level $U_2$ could also correspond approximately to the zero voltage.

It has been found that, by providing the temporarily increased intermediate level U2 in the control of the switching module SM1 for current flow operation in the diode flow direction, the switch-off behavior of the diode D1 can be influenced and optimized by influencing the ohmic characteristics and the charge carrier distribution of this component. In particular, the intermediate level can be used to influence the channel of the MOSFET Q1 in a targeted manner, and preferably without being opened or switching on the MOSFET ($U_2 < U_{TH}$), in order to reduce or influence the ohmic portion of the channel resistance during the commutation process of the diode. It has been shown that the intermediate level $U_2$ of the second control voltage during the down-commutation of the diode D1 accelerates its switch-off process, and oscillations and voltage spikes in the diode D1 and the current can be significantly reduced by this. This results in a faster commutation process that is of great importance, particularly for applications provided here with high-frequency clocked SiC power semiconductors.

To finally effect the commutation of the load current from the diode D1 of the first switching module SM1 to the MOSFET Q2 of the second switching module SM2, a third control voltage is applied to the second switching module SM2 in step S5 to switch on the MOSFET Q2. The level $U_3$ of the third control voltage is above the threshold voltage $U_{TH}$, above which the second MOSFET Q2 becomes minimally conductive. This is shown in FIG. 3 by the rising edge of the voltage $U_{GS2}$ in the lower half of the illustration. As can further be seen from this, the application of the intermediate level $U_2$ to the first switching module SM1 (step S4) and the switch-on of the second switching module SM2 (step S5) takes place in such a temporally coordinated manner that the MOSFET Q2 of the second switching module SM2 in the second time period $t_2$ can at least almost completely interconnect. In other words, the period within which the third control voltage $U_3$ is applied, until the MOSFET Q2 of the second switching module SM2 becomes fully conductive, is completely contained within the second time period $t_2$ or overlaps with it at least to a significant degree. In the sense used herein, it must be understood that a MOSFET Q1 or Q2 is completely conductive when it conducts at least 90%, and preferably at least 95% or more, of the current.

If this is ensured after the expiration of the second time period $t_2$, then in step S6 of the method 26 according to FIG. 2, a fourth control voltage $U_{GS1}$ is applied to the first MOSFET switching module SM1 to completely block it or keep it in the blocking status. This is shown in FIG. 3 in the third time period $t_3$, in which the control voltage for the first switching module SM1 again takes a negative level $U_4$ that is approximately equal to the level $U_1$ of the first control voltage and in which the switching module SM1 is reliably blocked. The control voltage $U_{GS2}$ of the second switching module SM2 is also positive and higher than the threshold voltage $U_{TH}$ in order to keep the second MOSFET Q2 in the conductive status. The method then ends in step S7.

If, in the opposite case, in the event of a load current flowing out of the switching arrangement (contrary to the current direction of the current $I_{out}$ as shown in FIG. 1), the second switching module SM2 conducts the current in the diode flow direction and it is switched off after a corresponding switching request, and the first switching module SM1 must be switched on, the commutation of the diode D2 of the second switching module SM2 is performed on the MOSFET Q1 of the first switching module SM1 in the same manner according to the method of FIG. 2 in conjunction with the corresponding control voltages $U_{GS1}$ and $U_{GS2}$, whereby the latter are swapped for the two switching modules SM1 and SM2 accordingly. This is shown in the right-hand part of FIG. 3, whereby the control voltages and time periods are provided with apostrophes to differentiate them. Otherwise, the above statements for performing the method also apply here accordingly.

The above-described switching sequence with the intermediate stage $U_2$ or $U_2'$ according to FIG. 2 can be applied e.g. only in respective reverse conductive operating phases (in the diode flow direction) of the switching modules SM1, SM2 to influence and improve the switch-off behavior of the respective inverse diode D1 or D2 of the one switching module SM1 or SM2 in the current commutation on the MOSFET Q2 and Q1 of the other switching module SM2 or SM1. However, this requires appropriate measures to detect the current flow direction through the switching modules.

In some embodiments, the method can advantageously be used independently of the current direction, i.e. in each current commutation process from SM1 to SM2 and vice versa, and in both the forward and reverse conduction mode in the down-commutating switching module SM1 or SM2. The corresponding success of the advantageous influencing of the switch-off process of an inverse diode then only occurs when the current is commutated from an inverse diode D1 or D2 of a switching module SM1 or SM2 to the MOSFET Q2 or Q1 of the other switching module SM2 or SM1. This case occurs on average about 50% of the time when the switching modules SM1 and SM2 are switched on and off alternately. Advantageously, a current direction detection is then unnecessary and can be omitted. In the event that the commutation of the current from the forward operation takes place from one MOSFET Q1 or Q2 to the other inverse diode D2 or D1, the intermediate level $U_2$ or $U_2'$ below the threshold voltage (i.e. $U_{GS}<U_{TH}$) ensures that no bridge short-circuit can be generated during the commutation.

Figure 4A:
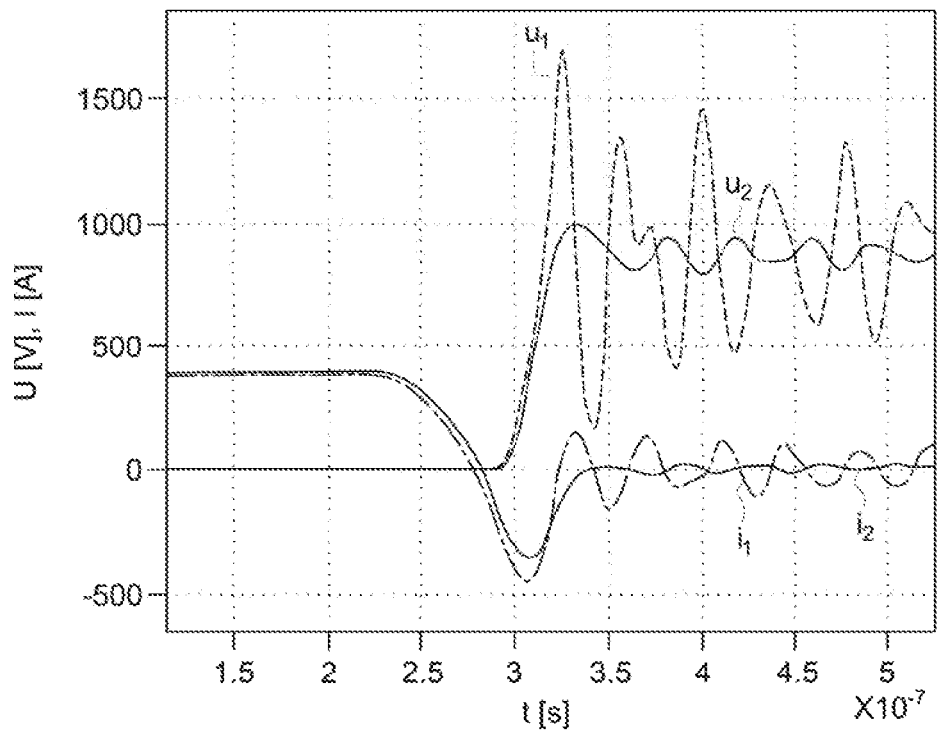
FIG. 4 shows the time profiles (a) of the voltages and currents at one of the switching modules when it is switched off without (dashed line) and with (solid line) the method according to the invention and (b) the resulting power flows.

As already mentioned, the targeted influencing of the channel resistance and the charge carrier distribution of a MOSFET Q1 or Q2 of a switching module SM1 or SM2 present in the component can be used to reduce the channel resistance and prevent a reverse current break of the inverse diode without opening the channel (i.e. $U_{GS}<U_{TH}$), to improve the commutation behavior of the diode D1 or D2 and to attenuate and reduce oscillations within the device. In addition to the ohmic portion of the channel resistance, a carrying of the current from the diode through the parallel MOSFET structure Q1 during the commutation process of the diode ensures an improved reverse recovery behavior and a softer switch-off behavior. This can be seen in FIG. 4, in which exemplary time profiles of voltages across the diode D1 or D2 or currents through them during a down-commutation process are shown in FIG. 4a. The voltages and currents without implementing the method 26 according to the invention are shown in FIG. 4a by a dashed line and designated $u_1$ and $i_1$, while those resulting from implementing the method according to the invention are drawn with a solid line and designated $u_2$ or $i_2$. It can be clearly seen that the oscillations and peaks of the diode voltage and the diode current can be significantly reduced by means of the method 26. During the commutation process of the inverse diode D1 or D2, this ensures an improved reverse recovery behavior or a softer switch-off behavior.

Figure 4B:
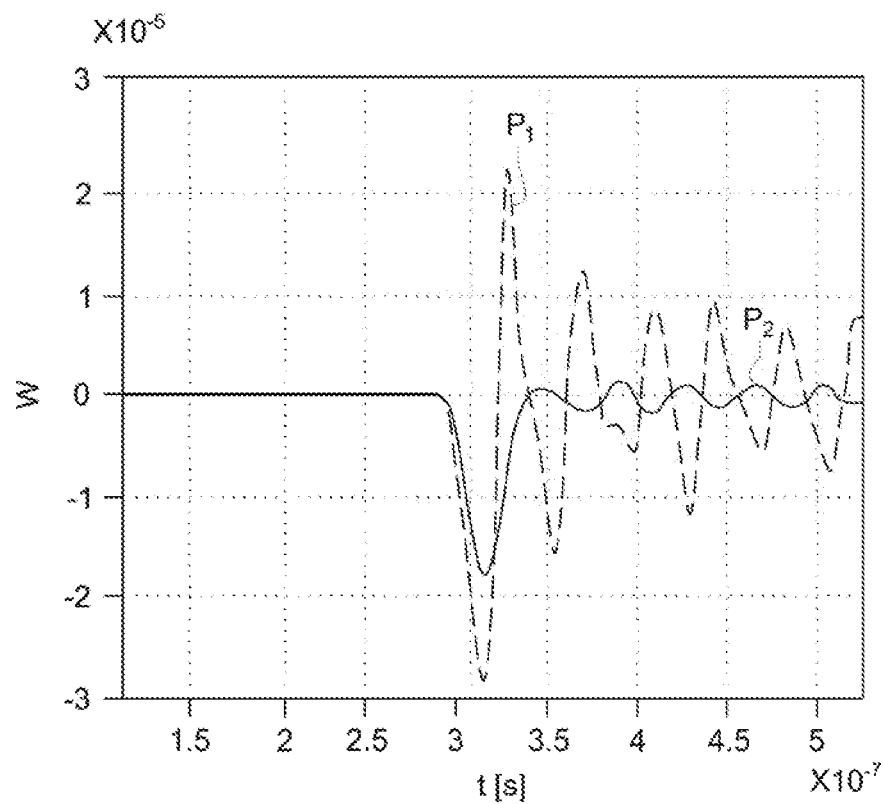

FIG. 4b shows the resulting power that is obtained essentially by multiplying the voltages and currents of the diode without (dashed line, $P_1$) or with (solid line, $P_2$) the implementation of the method 26 according to the invention. Significant oscillations of the power can be seen, which can be substantially reduced by the method 26 according to the invention. These oscillations result in corresponding switching losses that can also be reduced. In addition, the commutation process can be accelerated, because the voltage and current peaks can be reduced faster to a lower level appropriate for the complete commutation. Due to the reduced overvoltage on the inverse diode D1 or D2, an improved switch-on of the MOSFET is possible, resulting in a reduction in the switching energy and corresponding switching losses. The reduced overvoltage also permits higher currents to be switched, up to the point where the safe working area of the device or the total power dissipation loss has a limiting effect.

In an exemplary implementation with a power module 10 with self-blocking n-channel SiC MOSFETs, the threshold voltage $U_{TH}$ can e.g. be approximately 2-7 V, while the level of the control voltage for switching on the switching modules SM1, SM1, including the third control voltage $U_3$, can be approximately 15-25 V, e.g. approximately 18-20 V, the level $U_1$, $U_4$ of the first and fourth control voltage for switching off the switching modules SM1, SM2 can be approximately −3 to 10 V, e.g. approximately −5 V, and the intermediate level $U_2$ of the second control voltage can be approximately −10 to +4 V, often approximately −3 to +1 V or approximately the threshold voltage, e.g. approximately +3 V.

Figure 5:
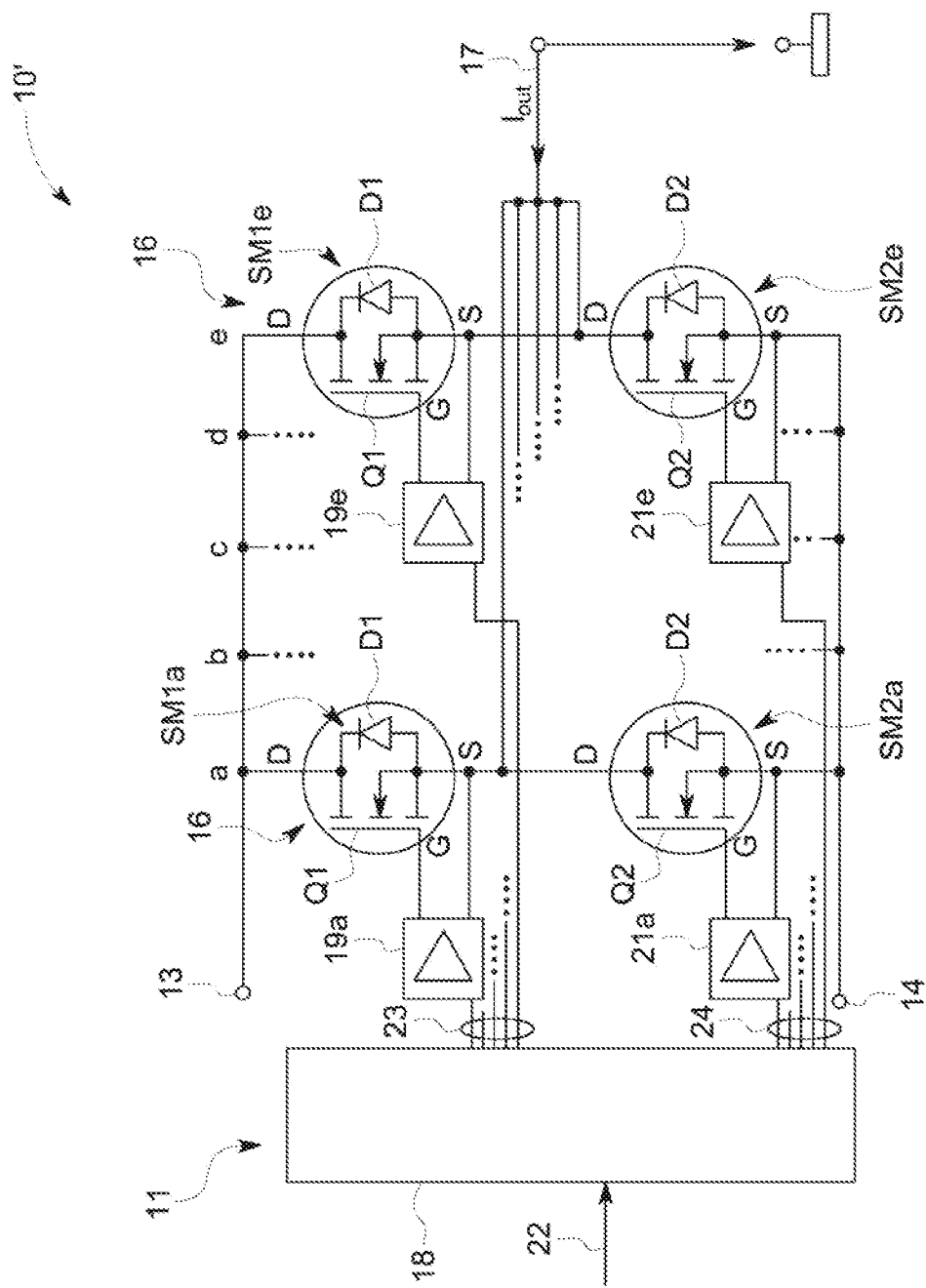
FIG. 5 shows a power module designed for a higher current-carrying capacity according to a modified embodiment of the invention in a highly simplified schematic representation.

With the method according to the invention, the oscillations attributable to the parasitic capacitances and inductances of the MOSFET switching modules SM1, SM2 can be significantly reduced, not only within the device but also and above all between parallel components. For example, FIG. 5 shows one embodiment whereby a plurality of half-bridges 16a-e are connected in parallel to each other to improve the current-carrying capacity of the power module 10'. The power module 10' can form a phase branch of a power converter. For the sake of clarity and simplicity, only two half-bridges 16a and 16e are shown in FIG. 5, it being shown that the device has further parallel branches b, c, d that have corresponding parallel half-bridges 16b-d. Each half-bridge 16a-e is connected between the positive and negative DC power supply terminals 13, 14, and the bridge taps 17a-17e are connected together to an output terminal 17 to which a load can be connected. It is understandable that more or fewer than five half-bridges 16a-e can be provided.

Returning to FIG. 3, further advantageous modifications of the method of the invention according to FIG. 2 are shown therein. In particular, the level $U_1$ of the first control voltage can be set higher than the level $U_4$ of the fourth control voltage, as shown in FIG. 3 by dashed lines in the time periods $t_1$ and $t_1'$. By providing a further intermediate stage, the switching behavior of the switching modules SM1, SM2 and the switch-off behavior of the inverse diode D1, D2 can be further influenced as desired. In addition, the switch-on of the switching module SM1 or SM2, to which the load current is commutated, can take place in at least two stages, with an intermediate stage $U_5$ or $U_5'$ of the control voltage, as shown in FIG. 3 by dashed lines in the time periods $t_2$ and $t_2'$. The intermediate stage $U_5$ or $U_5'$ must be below the level $U_3$ or $U_3'$ of the third control voltage for the complete switch-on of the switching module SM1 or SM2 and above the threshold voltage $U_{TH}$. This intermediate stage makes it possible, in the event of a short-circuit of a switching module SM1, SM2, to effectively reduce the short-circuit current level and reduce the circuit complexity required for detecting such a short-circuit.

FIG. 5 also shows the control device 11 with the evaluation and control unit 18 and the gate-driver units 19a-e and 21a-e that are assigned to the respective switching modules SM1a-e or SM2a-e. In principle, a common gate-driver unit could be provided for all the first switching modules SM1a-e together and a further gate-driver unit for all second switching modules SM2a-e together. In any case, all first switching modules SM1a-e and all second switching modules SM2a-e are each controlled synchronously to be switched on and off at the same time. The operation is otherwise as in the simple half-bridge 16 shown in FIG. 1. In particular, method 26 according to the invention of FIGS. 2 and 3 is also applied to the embodiment of FIG. 5 to improve the process of commutation of the load current from the intrinsic-body inverse diodes D of the upper first switching modules SM1 to the MOSFETs Q of the corresponding second switching modules SM2 in the common commutation circuit or vice versa. In particular, in the event of differing commutation inductances and therefore differing resonant frequencies of the switching modules connected in parallel, the method for reducing oscillations has an extremely positive effect. The reduced oscillations between the parallel components reduce the mutual interference, ensure faster commutation processes, reduce switching losses, and improve electromagnetic compatibility and operating behavior.

Figure 6:
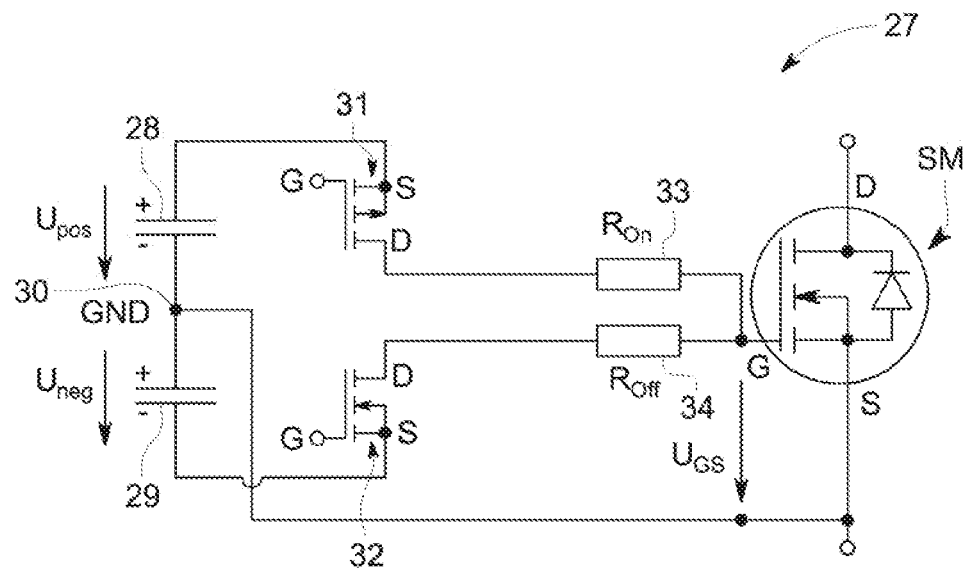
FIG. 6 shows one embodiment of a gate-driver unit for controlling switching modules when performing the method according to the invention.

FIG. 6 shows an exemplary switching device of a gate-driver unit 27 that can be used as the gate-driver unit 19, 21. Such gate-driver units 27 are known per se in the art and as such are not the subject of the invention. However, they can be used advantageously in implementing the method according to the invention 26 and in the control device 11 according to the invention.

The gate-driver unit 27 of the embodiment of FIG. 6 has two DC voltage sources 28, 29 that are connected in series with each other such that the negative pole of the first DC voltage source 28 is connected to the positive pole of the second DC voltage source 29. This connection point 30 is, in some examples, at the reference potential of the driver unit (GND) and has a zero potential with regard to the circuit of the driver unit. Incidentally, the two DC voltage sources 28, 29 provide different voltages $U_{pos}$ and $U_{neg}$. The positive pole of the first DC voltage source 28 is connected to a source contact S of a first switch 31 that is designed as a self-blocking MOSFET of the p-channel type. A negative pole of the second DC voltage source 29 is connected to the source terminal S of a second switch 32 that is designed as a self-blocking MOSFET of the n-channel type. The drain terminals D of the first and second switches 31, 32 are each connected via a closing resistor 33 ($R_{on}$) and an opening resistor 34 ($R_{off}$) to the gate terminal G of a switching module SM, whose source terminal S is connected to the connection point 30 of DC voltage sources 28, 29. The switching module SM corresponds to the switching module SM1 or SM2 in FIGS. 1 and 5.

The gate terminals G of the switches 31, 32 can be controlled with appropriate voltages to switch these switches on or off. If the first switch 31 is switched on while the second switch 32 is switched off, the voltage $U_{pos}$ of the first DC voltage source 28 is applied via the first switch 31 and the closing resistor 33 is applied to the gate terminal G of the switching module SM. Assuming that this voltage is above the threshold voltage of the switching module SM, the switching module SM is thereby switched on or made conductive.

If the first switch 31 is switched off, and the second switch 32 is switched on, the negative potential $U_{neg}$ of the second DC voltage source 29 is applied via the second switch 32 and the opening resistor 34 is applied to the gate electrode of the switching module SM. After this potential is below the zero potential, in any case below the threshold voltage of the switching module SM, the latter is thereby switched off.

If both the first and the second switches 31 and 32 are switched on, the sum voltage $U_{pos}+ U_{neg}$ of the first and the second DC voltage sources 28, 29 is applied via the switches 31, 32 and the resistors 33, 34 are applied to the gate electrode G of the switching module SM. The potential at the gate electrode G is determined by neglecting the throughput voltages of the switches 31, 32 through the voltages $U_{pos}$, $U_{neg}$ of the DC voltage sources 28, 29 and the size of the closing and opening resistors 33, 34 that act as voltage dividers. By appropriate selection of these variables, an arbitrary potential can be applied to the switching module SM that corresponds to the desired intermediate level $U_2$ or $U_2'$ of the second control voltage when implementing the method 26 of the invention according to FIGS. 2 and 3.

Figure 7:
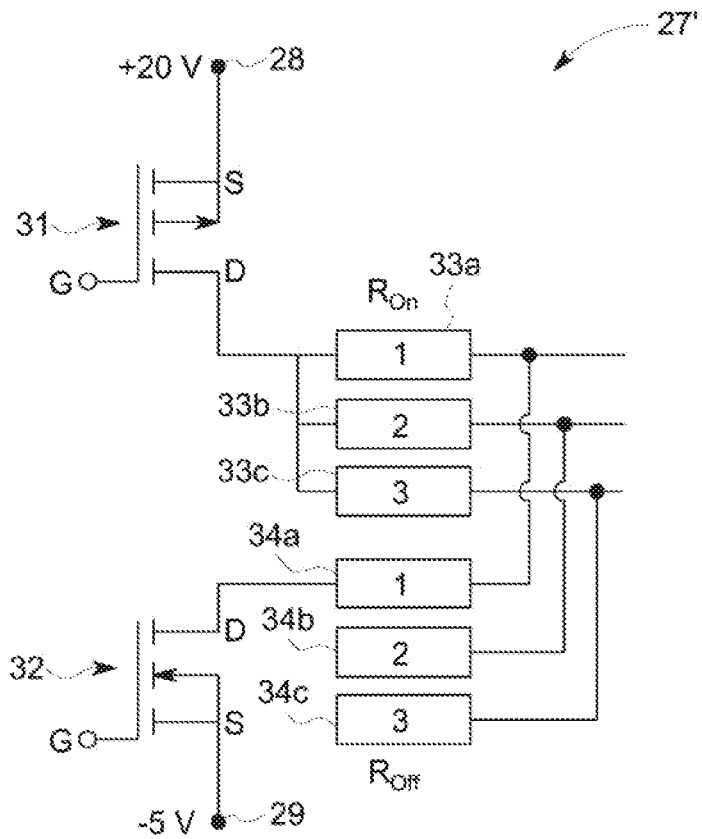
FIG. 7 shows a further embodiment of a gate-driver unit for controlling switching modules when performing the method according to the invention, in a simplified representation.

As a further development of the gate-driver unit 27 according to FIG. 6, FIG. 7 shows a further embodiment of a gate-driver unit 27' for use in the control of power modules 10 (FIG. 1) or 10' (FIG. 5) according to the invention. For reasons of simplification, the voltage sources 28, 29 and the switching module SM are not explicitly shown in FIG. 7. In contrast to the embodiment of FIG. 6, in each case a plurality of closing resistors 33a, 33b, 33c and opening resistors 34a, 34b, 34c are connected to the drain terminals D of the switches 31, 32, which can be connected on the one hand to gate terminals of switching modules connected in parallel, e.g. to the gate terminals of the switching modules SM1a-e or SM2a-e of the parallel-connected half-bridges 16a-e in the embodiment of FIG. 5. An arbitrary number of switching modules connected in parallel can be controlled synchronously by a single gate-driver unit 27' with a common output stage that is formed from the switches 31, 32, and a plurality of identical resistors 33a-c or 34a-c.

The control method according to the invention and the control device 11 according to the invention can be used for different applications. The power module 10 or 10' forms a part, e.g. a phase branch, of a power converter that can be used for power supply or distribution or for driving electrical machines. The power converter can be an inverter, a rectifier or a frequency changer. While the commutation circuits with the switching modules SM1, SM2 are shown in the form of half-bridges in FIGS. 1 and 5, it is understood that such switching modules can also be interconnected to other bridge circuits, e.g. full bridge circuits, reduced full bridge circuits, etc., as is generally known in the field of power converters. It is also possible for more than two switching modules to be arranged in series with each other in a common phase branch of a power converter. Further, other applications for the power modules according to the invention, the control method according to the invention and the control device according to the invention are possible. In all such applications, the invention makes it possible to reduce oscillations during switching operations without additional switching losses, e.g. those caused by increasing the gate resistance in the prior art, to improve the electromagnetic compatibility of the devices, the parallel switchability of such power modules and the dynamic current distribution.

A method and a device for controlling a commutation process of a load current between two switching modules SM1, SM2 are disclosed that each have a MOSFET Q1, Q2 that can be controlled by a gate-source voltage $U_{GS}$, and an intrinsic-body inverse diode D1, D2. To reduce oscillations in the down-commutation of the inverse diodes D1, D2 caused by parasitic circuit parameters and the switch-off behavior of the diode, after switching off one of the switching modules SM1, SM2, the gate-source control voltage $U_{GS1}$, $U_{GS2}$ applied to this switching module SM1, SM2 is temporarily switched off until being increased again the vicinity of the threshold voltage $U_{TH}$ for switching on the MOSFET Q1, Q2, before and while the other switching module SM2, SM1 is switched on, in order to commutate the current from the inverse diode D1, D2 of the one switching module SM1, SM2 to the MOSFET Q2, Q1 of the other switching module SM2, SM1.

What we claim is:

1. A method for controlling a commutation process of a load current from a first switching module to a second switching module, wherein the first switching module comprises a first MOSFET and a first inverse diode, and the second switching module comprises a second MOSFET and a second inverse diode, the first MOSFET and the second MOSFET being controlled by a gate-source voltage, the method comprising:
   connecting a first gate-driver unit directly to a gate and a source terminal of the first MOSFET and connecting a second gate-driver unit directly to a gate and source terminal of the second MOSFET;
   applying a first control voltage to the first switching module to switch it off for a first time period, wherein the level of the first control voltage is below a predetermined threshold voltage, above which the first MOSFET becomes minimally conductive, and wherein the first time period is selected so that the first inverse diode carries the load current;
   applying a second control voltage to the first switching module for a second time period to influence the switch-off behavior of the first inverse diode, wherein the second control voltage has an intermediate level between the level of the first control voltage and the level of the predetermined threshold voltage,
   applying a third control voltage to the second switching module for switching it on, wherein the level of the third control voltage is above the predetermined threshold voltage, above which the second MOSFET is minimally conductive, in order to cause a commutation of the load current from the first inverse diode to the second MOSFET, wherein a period in which the third control voltage is applied to until the second MOSFET becomes fully conductive is within the second time period;
   applying, after an expiration of the second time period, a fourth control voltage with a level below the intermediate level of the second control voltage to the first MOSFET to block it or hold it in the blocking status; and
   operating, via a control device, the first switching module and the second switching module in a complementary manner such that when one of the first switching module or the second switching module is conductive, the other of the first switching module or the second switching module is blocked at a same time.

2. The method according to claim 1, wherein a second control voltage with the second control voltage with the intermediate level which is between the level of the first control voltage for switching off a down-commutating switching module, the down-commutating switching module being one of the first switching module or the second switching module, and the level of the predetermined threshold voltage, for each commutation process from the first switching module to the second switching module and vice versa, is applied independent of the current flow direction of the load current through the down-commutating switching module before applying the third control voltage to completely switch on the other of the first switching module or the second switching module.

3. The method according to claim 1, wherein the second control voltage with the intermediate level which is between the level of the first control voltage for switching off the down-commutating switching module and the level of the predetermined threshold voltage, for each commutation process from the first switching module to the second switching module and vice versa, before applying the third control voltage to completely switch on the other of the first switching module or the second switching module, is only then applied when the instantaneous load current flows in the reverse current flow direction through the down-commutating switching module.

4. The method according to claim 1, wherein the switch-on of the first switching module or the second switching module, to which the load current is commutated, takes place in at least two stages, with an intermediate stage of the second control voltage that is below the level of the third control voltage to completely switch on the first switching module or the second switching module and that is above the predetermined threshold voltage.

5. The method according to claim 1, wherein the first and second switching modules are arranged in a common commutation circuit and are connected to each other in series via line elements.

6. The method according to claim 5, wherein the first and second switching modules form a half-bridge circuit that is connectable or connected to a DC voltage supply, and the connection point between switching modules forms a bridge tap for the connection of a load.

7. The method according to claim 1, wherein the first and second switching modules form a power module that forms at least one phase branch of a power converter.

8. The method according to claim 7, wherein the power converter can have a number of phase branches corresponding to the number of phases, each phase branch having one or more first switching modules in series or parallel to each other and one or more second switching modules connected in series or parallel to each other.

9. The method according to claim 7, wherein the power module or each phase branch of the power converter has two or more first switching modules connected in parallel to each other and two or more second switching modules connected in parallel to each other, wherein the first and second switching modules are respectively switched synchronously to each other.

10. The method according to claim 1, wherein the first and second switching modules are switched at switching frequencies of Hz to kHz range or in the MHz range.

11. The method according to claim 1 further comprises receiving a switching request signal from a higher-level control, wherein the first control voltage is applied in response to receiving the switching request signal.

12. The method according to claim 1 wherein the first time period can be set in advance such that the first inverse diode carries at least 90% of the load current from the first MOSFET under the assumed operating conditions, before the second control voltage is applied.

13. The method according to claim 1, wherein applying the third control voltage to the second switching module takes place during the second time period.

14. The method according to claim 13, wherein after applying the third control voltage to the second switching module within the second period, the second MOSFET then carries at least 90% of the load current from the first inverse diode, before the fourth control voltage is applied to the first switching module (SM).

15. The method according to claim 1, wherein the first and second MOSFETs are SiC MOSFETs.

16. The method according to claim 1, wherein the level of the control voltage for the first and second switching modules in the conductive status is approximately 15-25 V, the level of the first and fourth control voltage is approximately 0 to −10 V, the intermediate level of the second control voltage is approximately −10 to +4 V, and the threshold voltage is approximately 2 to 7 V.

17. The method according to claim 1, wherein the level of the second control voltage is higher than the level of the fourth control voltage and the level of the first control voltage.

18. A control device for controlling a commutation process of a load current from a first switching module to a second switching module, wherein the first switching module comprises a first MOSFET and a first inverse diode and the second switching module comprises a second MOSFET and a second inverse diode, the first MOSFET and the second MOSFET being controlled by a gate-source voltage, wherein the control device has a gate-control device that is communicatively connected to a higher-level control in order to receive binary switching request signals from the latter, and is configured to implement a method according to claim 1.

19. The control device according to claim 18, comprising at least one gate-driver unit that is capable of generating at least three different voltage levels, including the levels of the first, second and third control voltage in order to control the switching modules.

20. The control device according to claim 19, wherein the at least one gate-driver unit has a first controllable switch that is connected to a positive voltage potential and via a closing resistor to a gate of the first and second switching module, and a second controllable switch, that is connected to a negative voltage potential and via an opening resistor to the same gate of the first and second switching module, wherein the voltage potentials, the closing resistor and the opening resistor are dimensioned such that, when both the first controllable switch and the second controllable switch are switched on simultaneously, the intermediate level of the second control voltage is applied to the gate of the first and second switching module.

* * * * *